(12) United States Patent
McConnelee et al.

(10) Patent No.: US 8,114,708 B2
(45) Date of Patent: Feb. 14, 2012

(54) SYSTEM AND METHOD FOR PRE-PATTERNED EMBEDDED CHIP BUILD-UP

(75) Inventors: Paul McConnelee, Albany, NY (US); Donald Cunningham, Dallas, TX (US); Kevin Durocher, Waterford, NY (US)

(73) Assignee: General Electric Company, Schenectady, NY (US)

( * ) Notice: Subject to any disclaimer, the term of this patent is extended or adjusted under 35 U.S.C. 154(b) by 464 days.

(21) Appl. No.: 12/241,236

(22) Filed: Sep. 30, 2008

(65) Prior Publication Data

US 2010/0078797 A1  Apr. 1, 2010

(51) Int. Cl.
*H01L 23/48* (2006.01)
(52) U.S. Cl. ........ 438/109; 438/106; 257/678; 257/686; 257/690; 257/698; 257/700; 257/E23.001; 257/E23.003; 257/E23.01; 257/E23.011; 257/E23.019
(58) Field of Classification Search .......... 257/690–693, 257/700; 361/764, 762, 761; 174/260
See application file for complete search history.

(56) References Cited

U.S. PATENT DOCUMENTS

| | | | | | |
|---|---|---|---|---|---|
| 4,628,407 | A * | 12/1986 | August et al. | ............... | 361/711 |
| 5,600,541 | A * | 2/1997 | Bone et al. | ............... | 361/707 |
| 5,831,810 | A * | 11/1998 | Bird et al. | ............... | 361/301.1 |
| 5,937,515 | A * | 8/1999 | Johnson | ............... | 29/847 |
| 6,029,343 | A * | 2/2000 | Wieloch | ............... | 29/830 |
| 6,324,067 | B1 * | 11/2001 | Nishiyama | ............... | 361/761 |
| 6,359,235 | B1 * | 3/2002 | Hayashi | ............... | 174/260 |
| 6,548,330 | B1 * | 4/2003 | Murayama et al. | ............... | 438/127 |
| 7,122,403 | B2 | 10/2006 | Chandran et al. | | |
| 7,209,362 | B2 * | 4/2007 | Bando | ............... | 361/761 |
| 7,230,332 | B2 * | 6/2007 | Hsu | ............... | 257/700 |
| 7,287,321 | B2 * | 10/2007 | Takeuchi et al. | ............... | 29/834 |
| 7,457,129 | B2 * | 11/2008 | Ikezawa et al. | ............... | 361/735 |
| 7,619,317 | B2 * | 11/2009 | Lien et al. | ............... | 257/787 |
| 7,795,073 | B2 * | 9/2010 | Han et al. | ............... | 438/106 |
| 7,839,649 | B2 * | 11/2010 | Hsu | ............... | 361/761 |
| 7,842,887 | B2 * | 11/2010 | Sakamoto et al. | ............... | 174/260 |
| 7,855,342 | B2 * | 12/2010 | Sakamoto et al. | ............... | 174/260 |
| 7,989,944 | B2 * | 8/2011 | Tuominen | ............... | 257/687 |
| 2003/0107119 | A1 * | 6/2003 | Kim | ............... | 257/686 |
| 2004/0207073 | A1 * | 10/2004 | Hasebe et al. | ............... | 257/706 |
| 2005/0253244 | A1 * | 11/2005 | Chang | ............... | 257/692 |
| 2006/0003495 | A1 * | 1/2006 | Sunohara et al. | ............... | 438/124 |
| 2007/0025092 | A1 * | 2/2007 | Lee et al. | ............... | 361/761 |
| 2007/0080447 | A1 * | 4/2007 | Hasebe et al. | ............... | 257/706 |
| 2007/0108583 | A1 * | 5/2007 | Shim et al. | ............... | 257/686 |
| 2008/0017409 | A1 * | 1/2008 | Takeuchi et al. | ............... | 174/260 |
| 2008/0150118 | A1 * | 6/2008 | Van Veen et al. | ............... | 257/688 |
| 2008/0174008 | A1 * | 7/2008 | Yang et al. | ............... | 257/723 |
| 2008/0265401 | A1 * | 10/2008 | Lee et al. | ............... | 257/700 |

(Continued)

*Primary Examiner* — Victor A Mandala
*Assistant Examiner* — William Harriston
(74) *Attorney, Agent, or Firm* — Ziolkowski Patent Solutions Group, SC; Jean K. Testa

(57) ABSTRACT

A system and method for forming an embedded chip package is disclosed. The embedded chip package includes a first chip portion having a plurality of pre-patterned re-distribution layers joined together to form a pre-patterned lamination stack, with the pre-patterned lamination stack having a die opening extending therethrough. The embedded chip package also includes a die positioned in the die opening and a second chip portion having at least one uncut re-distribution layer, with the second chip portion affixed to each of the first chip portion and the die and being patterned to be electrically connected to both of the first chip portion and the die.

15 Claims, 8 Drawing Sheets

U.S. PATENT DOCUMENTS

2008/0277150 A1* 11/2008 Takashima et al. ............ 174/260
2008/0308917 A1* 12/2008 Pressel et al. ................. 257/676
2009/0243081 A1* 10/2009 Kapusta et al. ............... 257/693
2009/0309212 A1* 12/2009 Shim et al. .................... 257/700
2009/0321915 A1* 12/2009 Hu et al. ....................... 257/690
2010/0244226 A1*  9/2010 Sabatini et al. ............... 257/692
2010/0308452 A1* 12/2010 Iihola et al. ................... 257/692

* cited by examiner

SYSTEM AND METHOD FOR PRE-PATTERNED EMBEDDED CHIP BUILD-UP

BACKGROUND OF THE INVENTION

Embodiments of the invention relate generally to integrated circuit packages and, more particularly, to embedded chip build-up. Embedded chip packages are manufactured using pre-patterned laminate re-distribution layers and placement of a die relative to the pre-patterned layers.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization and higher reliability. New packaging technology has to further provide for the possibilities of batch production for the purpose of large-scale manufacturing thereby allowing economy of scale.

A standard CSP manufacturing process typically begins with placement of one or more dies onto a top surface of a silicon integrated circuit (IC) substrate. A plurality of re-distribution layers are then deposited onto the IC substrate and the die(s) and are patterned to form a thin-film metal re-routing and interconnection system. The re-distribution layers are typically formed from a benzocyclobutene (BCB) or polyimide material, for example, and applied via a spin-on or lamination application process.

Deposition of the die and the re-distribution layers in this manner, however, has inherent limitations in regards to the production process and the structure and functionality of the resulting embedded chip that is produced. For example, the layer-by-layer application of the multiple re-distribution layers onto the previously placed die(s) leads to an increased fabrication cycle time. Additionally, as the re-routing and interconnection system is formed by a layer-by-layer application of the multiple re-distribution layers onto the previously placed die(s), there is no ability to pre-test the re-routing and interconnection system. Therefore, if the re-routing and interconnection system is found to be defective based on post-application (onto the die) testing, disassembly of the chip and re-working of the die increases production costs.

Advancements in IC chip packaging requirements also pose challenges to the existing embedded chip build-up process. That is, it is desired in many current embedded chip packages to have an increased number of re-distribution layers, with eight or more re-distribution layers being common. The standard embedded chip build-up process, in which the one or more dies are initially placed on the IC substrate and the re-distribution layers are subsequently applied in a layer-by-layer fashion, can be unsuitable for creating a re-routing and interconnection system with such an increased number of re-distribution layers. Application of an increased number of re-distribution layers in a layer-by-layer fashion can lead to warpage in the rerouting and interconnection system. Re-distribution layer warpage imparts stress to the silicon wafer substrate, which can impose limitations on formation of an input/output (I/O) system on the embedded chip. That is, because of the stress imparted on the silicon wafer by the re-distribution layer warpage, larger and more robust bumps (i.e., solder balls/connections) and an underfill epoxy are needed for formation of the I/O system interconnection. This limits the bump density of the I/O system and limits the level of miniaturization of the chip that is achievable.

Accordingly there is a need for a method for embedded chip fabrication that allows for the application of multiple re-distribution layers while minimizing stress and warpage of the wafer die. There is a further need for a fabrication method that provides for a shorter manufacturing cycle time and that allows for pre-testing of the re-routing and interconnection system prior to placement of the die.

BRIEF DESCRIPTION OF THE INVENTION

Embodiments of the invention overcome the aforementioned drawbacks by providing a method of chip fabrication in which the embedded chip package is manufactured using pre-patterned laminate re-distribution layers and placement of a die relative to the pre-patterned layers. A laminate stack is formed from the pre-patterned laminate layers prior to placement of the die relative thereto, and additional laminate layers are then placed on, and electrically connected to, the laminate stack and the die.

In accordance with one aspect of the invention, an embedded chip package includes a first chip portion comprising a plurality of pre-patterned re-distribution layers joined together to form a pre-patterned lamination stack, the pre-patterned lamination stack having a die opening extending therethrough. The embedded chip package also includes a die positioned in the die opening and a second chip portion comprising at least one uncut re-distribution layer, the second chip portion affixed to each of the first chip portion and the die and being patterned to be electrically connected to both of the first chip portion and the die.

In accordance with another aspect of the invention, a method of forming an embedded chip package includes providing an initial polymer laminate layer and patterning the initial polymer laminate layer to include a plurality of vias and a plurality of metal interconnects, such that each of the plurality of metal interconnects extends down through a respective via. The method also includes laminating a plurality of additional polymer laminate layers to the initial polymer laminate layer to form a laminate stack, patterning each of the additional polymer laminate layers to include a plurality of vias and a plurality of metal interconnects, and cutting a die opening through the laminate stack. The method further includes adhering the laminate stack to a base unpatterned polymer laminate layer, adhering a die to the base unpatterned polymer laminate layer, the die positioned within the die opening of the laminate stack, and patterning the base unpatterned polymer laminate layer to include a plurality of vias and a plurality of metal interconnects, so as to electrically connect the base unpatterned polymer laminate layer to the die and to the laminate stack.

In accordance with yet another aspect of the invention, a method for manufacturing a wafer level package includes sequentially laminating a plurality of re-distribution layers to form a pre-patterned lamination stack, each of the plurality of re-distribution layers having a plurality of vias and metal interconnects formed therein. The method also includes forming a die opening in the pre-patterned lamination stack, securing the pre-patterned lamination stack to an uncut base re-distribution layer, affixing a die to the uncut base re-distribution layer, the die positioned within the die opening of the pre-patterned lamination stack, and forming a plurality of vias and metal interconnects in the uncut base re-distribution layer to electrically connect the uncut base re-distribution layer to the die and to the pre-patterned lamination stack.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

The present invention provides for a method of forming an embedded chip package. The embedded chip package is manufactured using pre-patterned laminate re-distribution layers and placement of a die relative to the pre-patterned layers. A laminate stack is formed from the pre-patterned laminate layers prior to placement of the die relative thereto, and additional laminate layers are then placed on, and electrically connected to, the laminate stack and the die.

Figure 1:
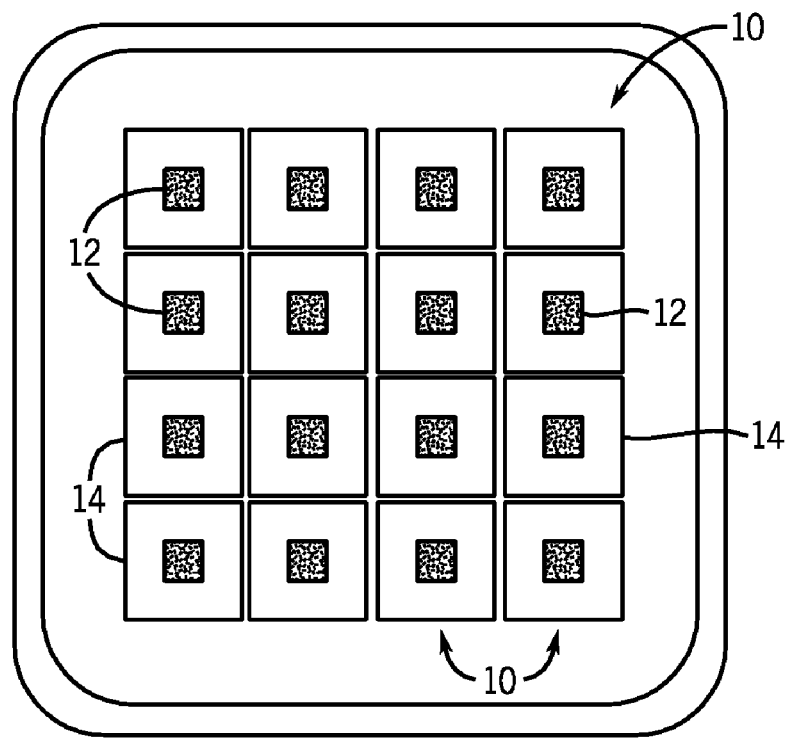
FIG. 1 is a top view of a plurality of embedded chip packages according to an embodiment of the invention.

Referring to FIG. 1, a plurality of manufactured embedded chip packages (ECPs) 10 or embedded chip modules are shown. Each ECP 10 includes a die 12 connected with a plurality of re-distribution layers 14 (i.e., laminate layers). Each die 12 is formed from a monosilicon crystal ingot or polysilicon crystal ingot and prepared such that an integrated circuit (IC) layout is formed on its surface. Each of the plurality of re-distribution layers 14 is in the form of a pre-formed laminate sheet or film that can be placed relative to the die 12. The re-distribution layers 14 can be formed of Kapton®, Ultem®, polytetrafluoroethylene (PTFE), or another polymer film, such as a liquid crystal polymer (LCP) or a polyimide material. As shown in FIG. 1, each ECP 10 is formed by dicing through re-distribution layers 14 in an area between adjacent ECPs 10.

Figure 2:
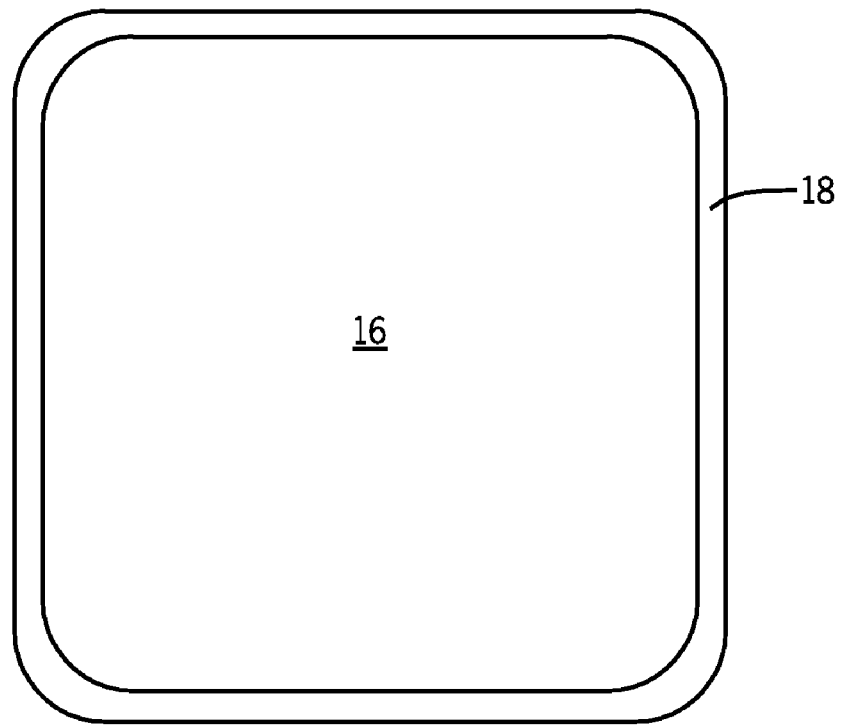
FIGS. 2-9 are schematic cross-sectional side views of an embedded chip package during various stages of a manufacturing/build-up process according to an embodiment of the invention.

As shown in FIGS. 2-9, a technique for manufacturing a plurality of ECPs 10 (i.e., an embedded chip build-up) is set forth, according to an embodiment of the invention. Referring to FIG. 2, a complete frame of an initial re-distribution layer 16 is provided and mounted on a frame 18 to allow for additional manufacturing steps to be performed thereon. As set forth above, the initial re-distribution layer 16 is in the form of a flexible polymer laminate layer, such as Kapton®, Ultem®, polytetrafluoroethylene (PTFE), or another polymer/polyimide film, and is of a size that allows for the production of a plurality of ECPs 10 therefrom. A portion of the complete frame of the initial re-distribution layer 16 is shown in FIGS. 3A-3C. According to one embodiment of the invention, the initial re-distribution layer 16 is provided as a "pre-patterned" layer having a plurality of base metal interconnects 18 formed thereon (FIG. 3A). The initial re-distribution layer 16 is further pre-patterned to have a plurality of vias 20 which are drilled through the polymer material forming the re-distribution layer (FIG. 3B). According to an exemplary embodiment, the vias 20 are formed by way of a laser ablation or laser drilling process and are formed at positions corresponding to base metal interconnects 18, so as to expose the base metal interconnects 18. Alternatively, it is also recognized that vias 20 may be formed by way of other methods including: plasma etching, photo-definition, or mechanical drilling processes.

Figure 3A:
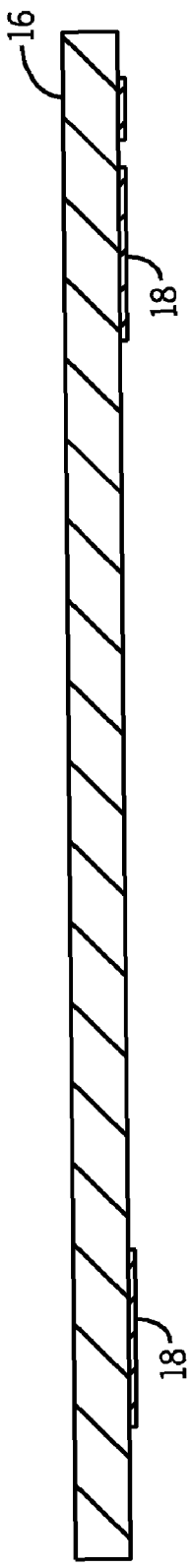
Figure 3B:
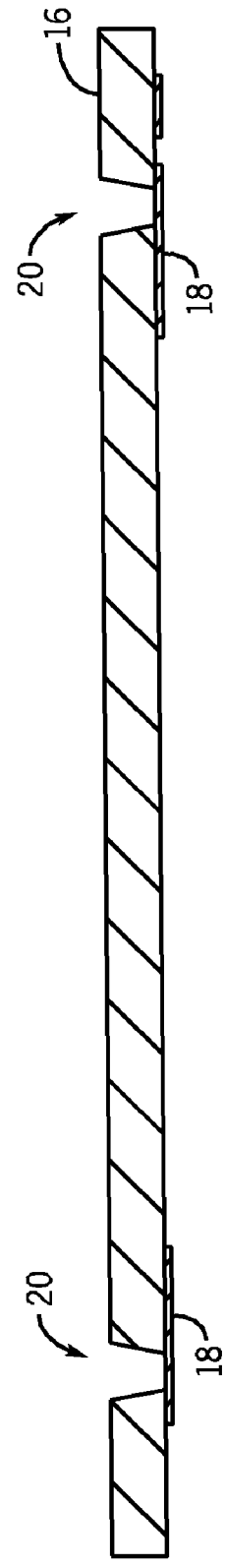
Figure 3C:
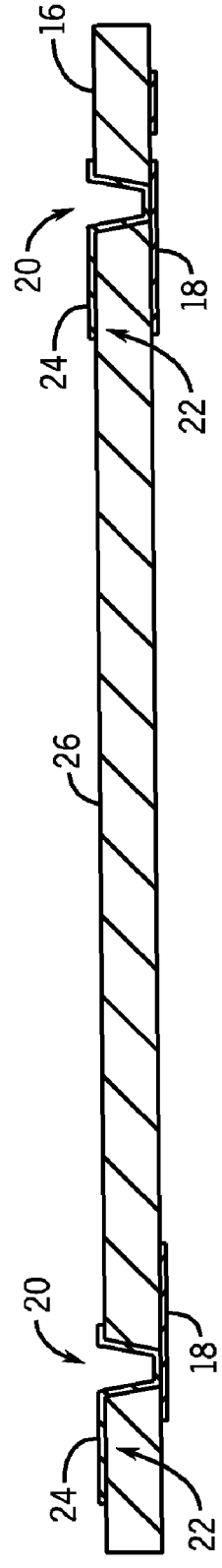

As shown in FIG. 3C, the pre-patterning of the initial re-distribution layer 16 is completed by the application of a metal layer/material 22 (e.g., a seed metal and/or copper) applied onto the re-distribution layer by way of, for example, a sputtering or electroplating process. The deposited metal layer/material 22 is then formed into metal interconnects 24. According to one embodiment of the invention, metal layer/material 22 is patterned and etched such that metal interconnects 24 are formed that extend from a front/top surface 26 of initial re-distribution layer 16 and down through vias 20. Metal interconnects 24 thus form an electrical connection with base metal interconnects 18. According to another embodiment of the invention, it is recognized that through vias 20 could be drilled through initial re-distribution layer 16 and the metal interconnects 24 could be formed on both top and bottom surfaces of the re-distribution layer.

Figure 4:
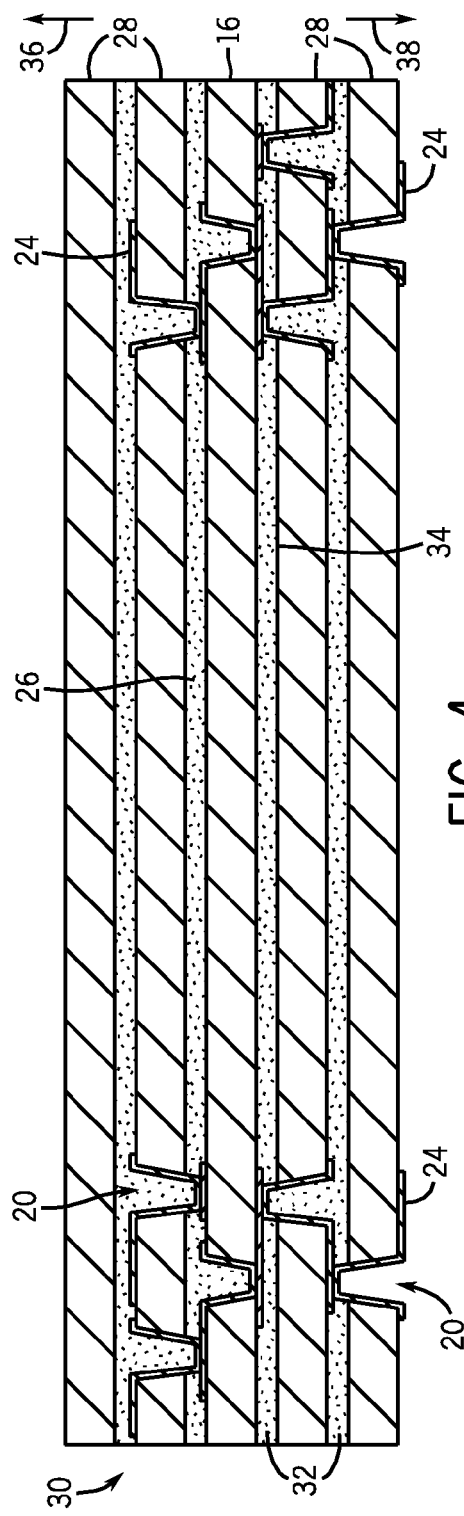

Referring now to FIG. 4, in a next step of the manufacturing technique, a plurality of additional re-distribution layers 28 are laminated onto the initial re-distribution layer 16 to form a laminate stack 30 of re-distribution layers (i.e., a first chip portion). The plurality of additional re-distribution layers 28 are applied to the initial re-distribution layer 16 through a series of lamination and pre-patterning steps. An adhesive layer 32 is applied between the initial re-distribution layer 16 and the additional re-distribution layers 28 applied thereto, and the adhesive layer 32 is also applied between each subsequent pair of additional re-distribution layers 28 laminated to one another. According to one embodiment of the invention, the initial re-distribution layer 16 forms a "central" re-distribution layer, and the additional re-distribution layers 28 are applied to both the front/top surface 26 and a back/bottom surface 34 of the initial re-distribution layer 16. Such a double-sided lamination process serves to reduce stresses imparted to the initial re-distribution layer 16 and prevent warpage thereof.

A plurality of vias 20 is formed in each of the plurality of additional re-distribution layers 28. Metal interconnects 26 are also formed/patterned to extend down through vias 20 and through each additional re-distribution layer 28, so as to electrically connect each of the plurality of additional re-distribution layers 28 in the laminate stack 30. As shown in FIG. 4, for those additional re-distribution layers 28 extending out in a first direction 36 from the front/top surface 26 of the initial re-distribution layer 16, the vias 20 are formed (i.e., drilled, laser ablated) from a second direction 38 opposite the first direction 36. That is, vias 20 in the additional re-distribution layers 28 extending out in first direction 36 from the front/top surface 26 of the initial re-distribution layer 16 are formed from the top-down. Conversely, for those additional re-distribution layers 28 extending out in the second direction 38 from the back/bottom surface 34 of the initial re-distribution layer 16, the vias 20 are drilled from the first direction 36. That is, vias 20 in the additional distribution layers 28 extending out in second direction 38 from the back/bottom surface 34 of the initial re-distribution layer 16 are drilled from the bottom-up. The forming of vias 20 in each of the additional re-distribution layers 28 from both directions, allows for the double-sided addition of additional re-distribution layers 28 to the initial re-distribution layer 16. Any desired amount of additional re-distribution layers 28 can be applied to initial re-distribution layer 16. As shown in FIG. 4, four additional re-distribution layers 28 are applied to initial re-distribution layer 16 to form a lamination stack 30 including five re-distribution layers, but it is recognized that more or less re-distribution layers could be applied based on a desired configuration.

Figure 5:
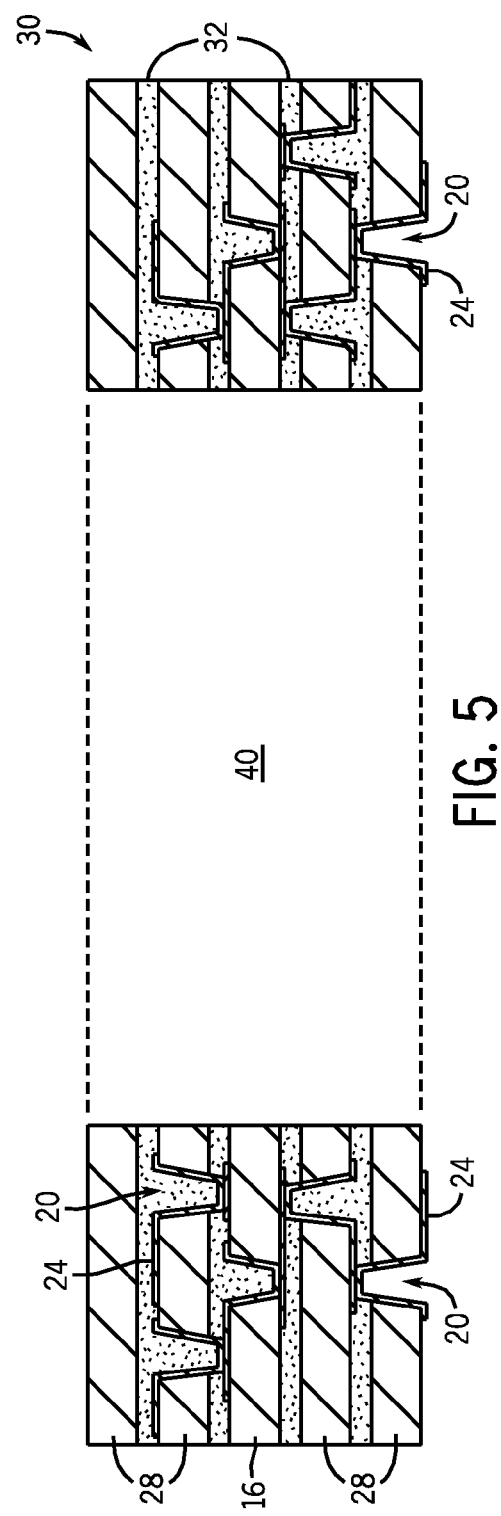
Figure 6:
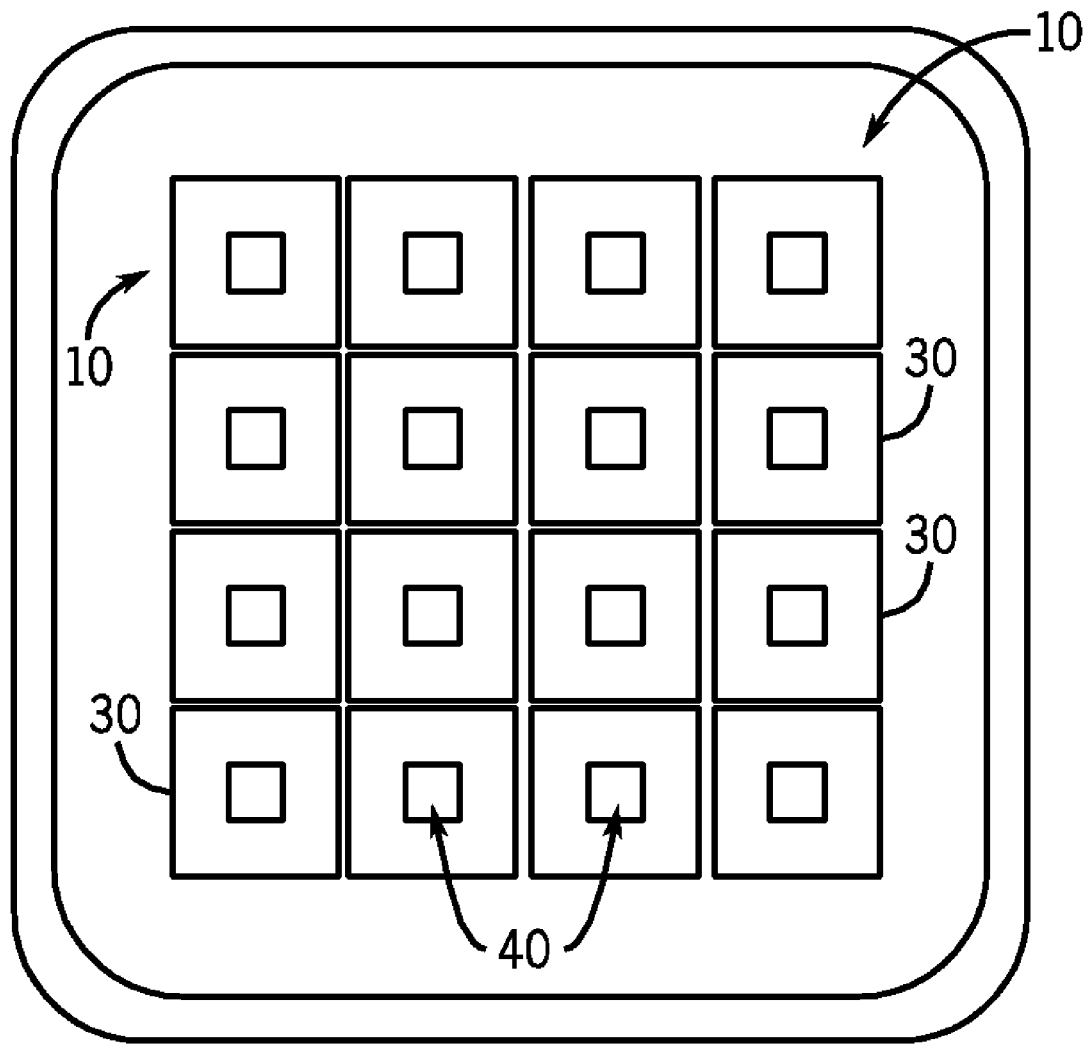

Referring now to FIGS. 5 and 6, upon the completion of the lamination stack 30 by way of the adhering of the plurality of additional re-distribution layers 28, a die opening 40 (or plurality of die openings) are formed through the lamination stack 30. The die opening 40 is of a size and shape essentially matching that of the die 12 (FIG. 1) and extends through the length of the lamination stack 30. As shown in FIG. 6, the resulting shape of each lamination stack 30 in each ECP 12 is that of a "window frame" construction. It is recognized that the fabrication of the lamination stack 30 as a separate component (i.e., a first chip portion) of the ECP 10 (FIG. 1) allows for testing of the lamination stack 30 before attachment thereof to the die 12 (FIG. 1). Such a pre-attachment testing of the lamination stack 30 prevents attachment of dies 12 to a defective lamination stack, reducing potential occurrences of die re-working due to a defective lamination stack.

Figure 7:
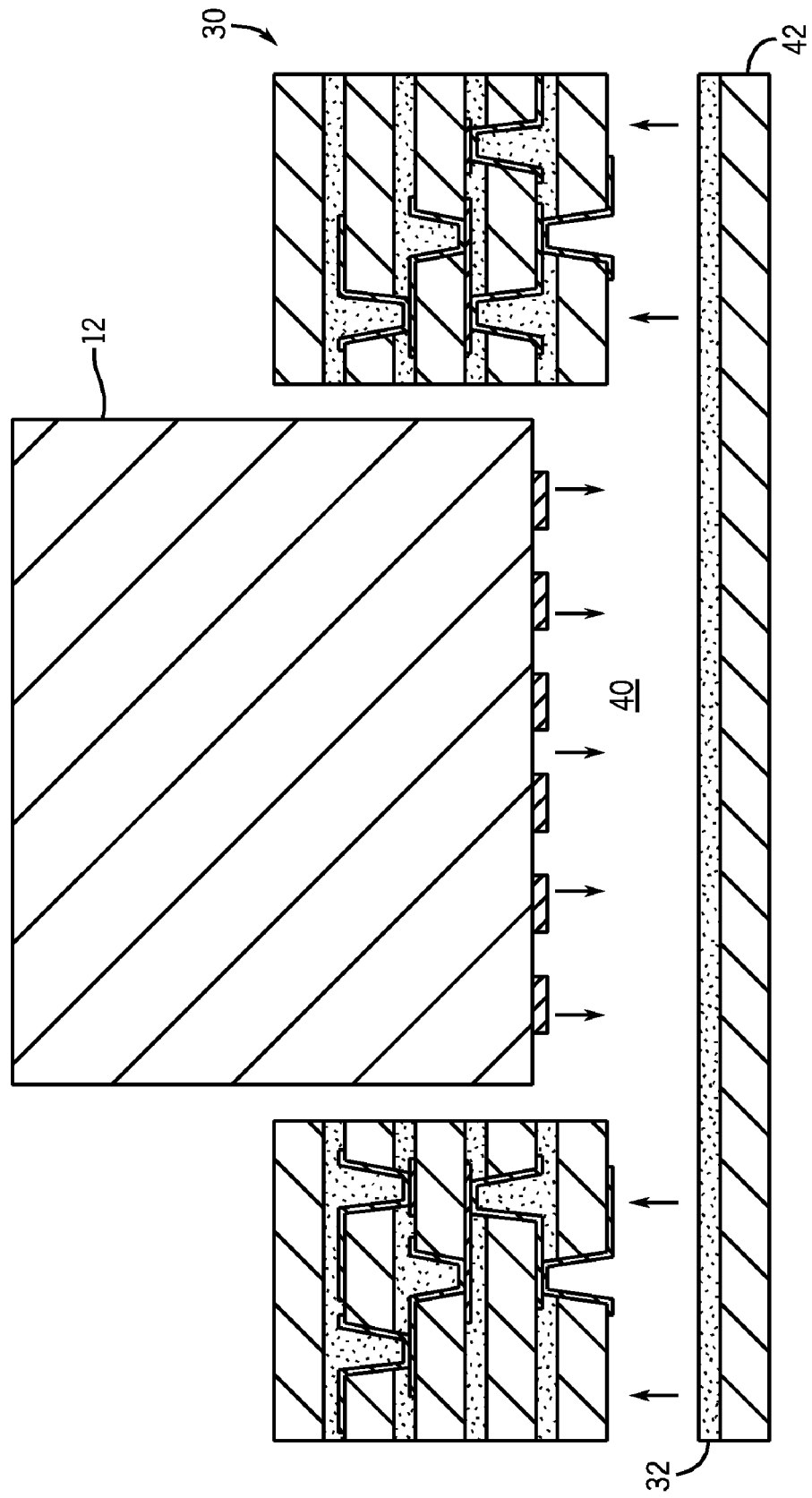

In a next step in the manufacturing technique/process, shown in FIG. 7, an uncut, unpatterned base re-distribution layer 42 (i.e., base polymer laminate layer) is applied to one of the top or bottom surfaces of the laminate stack 30 by way of an adhesive layer 32. As shown in FIG. 7, the base re-distribution layer 42 and adhesive layer 32 extend over the die opening 40 formed in the laminate stack 30. The laminate stack 30 is secured to the base re-distribution layer 42, and the die 12 is subsequently placed with die opening 40 and also secured to the base re-distribution layer 42 by way of the adhesive layer 32. A vacuum lamination and pressure bake curing process can be performed upon placement of the lamination stack 30 and die 12 onto the adhesive layer 32 and base re-distribution layer 42 to secure the die 12 relative to the laminate stack 30 and within die opening 40.

Figure 8:
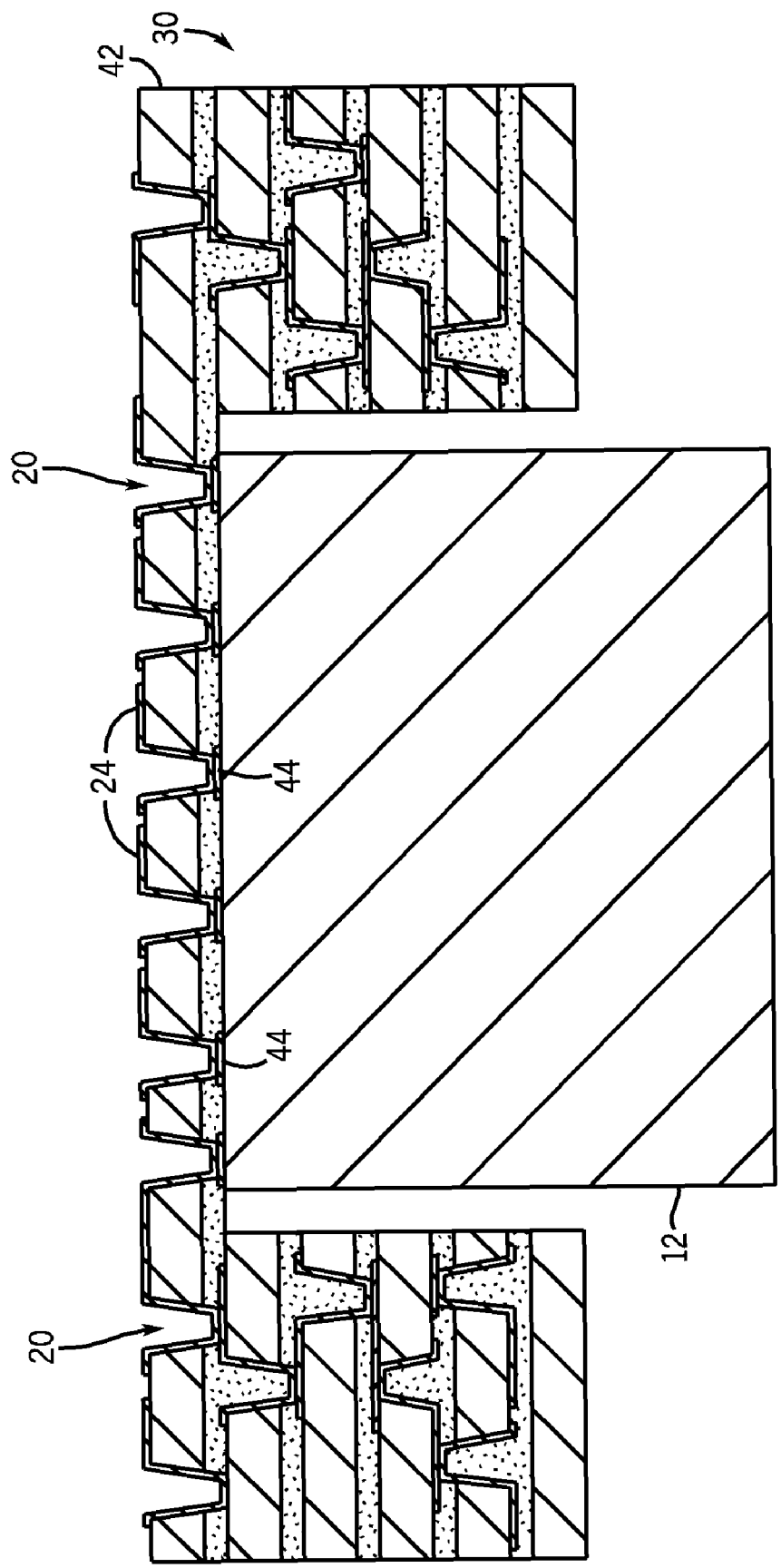
Figure 9:
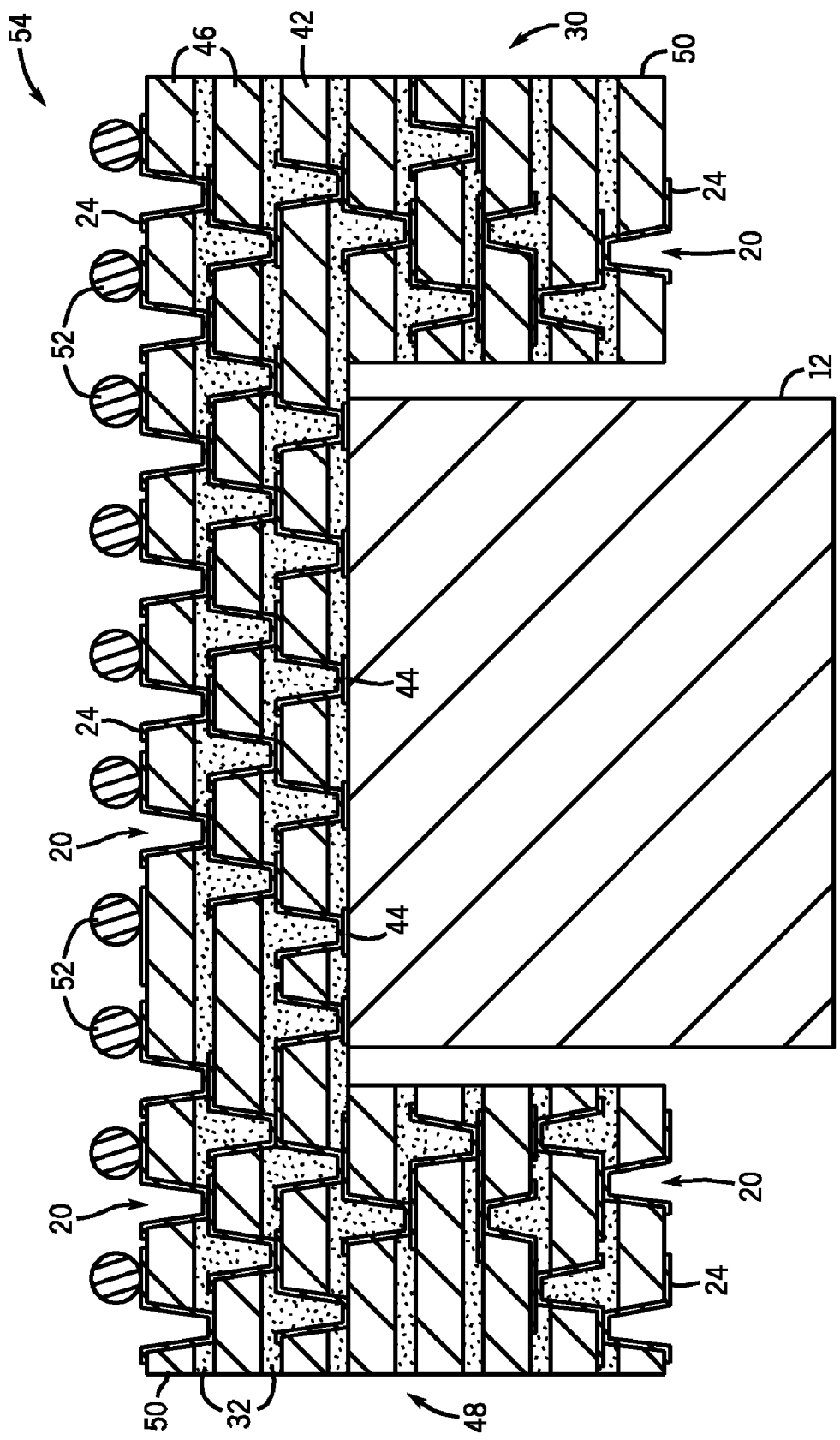

Referring now to FIG. 8, in a next step of the manufacturing technique/process, base re-distribution layer 42 is drilled to form vias 20 therein. Metal interconnects 24 are formed to extend down through vias 20 so as to form an electrical connection with contacts 44 placed on the die 12. Die 12 is thus electrically connected to the lamination stack 30 through base re-distribution layer 42. As shown in FIG. 9, according to one embodiment of the invention, additional uncut, unpatterned re-distribution layers 46 are added to the base re-distribution layer 42, with an adhesive layer 32 used to secure each additional uncut, unpatterned re-distribution layer 46. Subsequent to the application and securing of each additional uncut, unpatterned re-distribution layer 46, that layer is patterned through the formation of vias 20 and metal interconnects 24 thereon. The uncut, unpatterned base re-distribution layer 42 and additional uncut, unpatterned re-distribution layers 46 are thus electrically connected and form a second chip portion 48 of the ECP 10 (FIG. 1). It is recognized that additional testing of the ECP 10 can be performed after completion of the second chip portion 48, and the electrical connection of the second chip portion to die 12 and lamination stack 30. That is, second chip portion 48 and die 12 can be tested for full electrical function.

As shown in FIG. 9, an outermost re-distribution layer 50 from each of the first portion 30 (i.e., lamination stack) and second portion 48 (i.e., uncut, unpatterned re-distribution layers 42, 46) of the ECP 10 are patterned to include a plurality of vias 20 and metal interconnects 24 thereon. The metal interconnects 24 on these outermost re-distribution layers 50 allows for the connection of a plurality of input/output (I/O) interconnections 52, as shown in FIG. 9. According to one embodiment of the invention, and as shown in FIG. 9, I/O interconnections 52 are applied to metal interconnects 24 on a topmost re-distribution/laminate layer 50 to form an I/O system interconnection 54. In one embodiment, I/O interconnections 52 are formed as balls that are soldered to metal interconnects 24 (i.e., solder balls). It is also envisioned, however, that other forms of I/O interconnections 52 can be attached, such as plated bumps, pillar bumps, gold stud bumps, metal filled polymer bumps, or wirebond connections/pads, such that a reliable connection can be formed between the ECP 10 and a motherboard (not shown) to which it is to be attached.

The re-distribution of metal interconnects 24 provided by the plurality of re-distribution layers in the first and second chip portions 30, 48 allows for an increased number of I/O interconnections 52 to be formed on a top surface of ECP 10. That is, for example, solder connections 52 can be more densely packed on ECP 10 due to the re-distribution of metal interconnects 24. Solder connections 52 on ECP 10 are thus formed having a decreased pitch and height as compared to conventional solder balls. For example, solder connections 52 can be formed to have a height of 180 micrometers and a pitch of 80 micrometers. The formation of solder connections 52 at such a size on a flexible polymer laminated/re-distribution layer lowers connection joint stress between the ECP 10 and a motherboard (not shown) to which it is to be mounted, thus also negating the need for an under-filling epoxy mixture that would be applied between the solder connections 52, ECP 10, and a motherboard after soldering of the ECP 10 to the motherboard, as is typically performed in the prior art.

Figure 10:
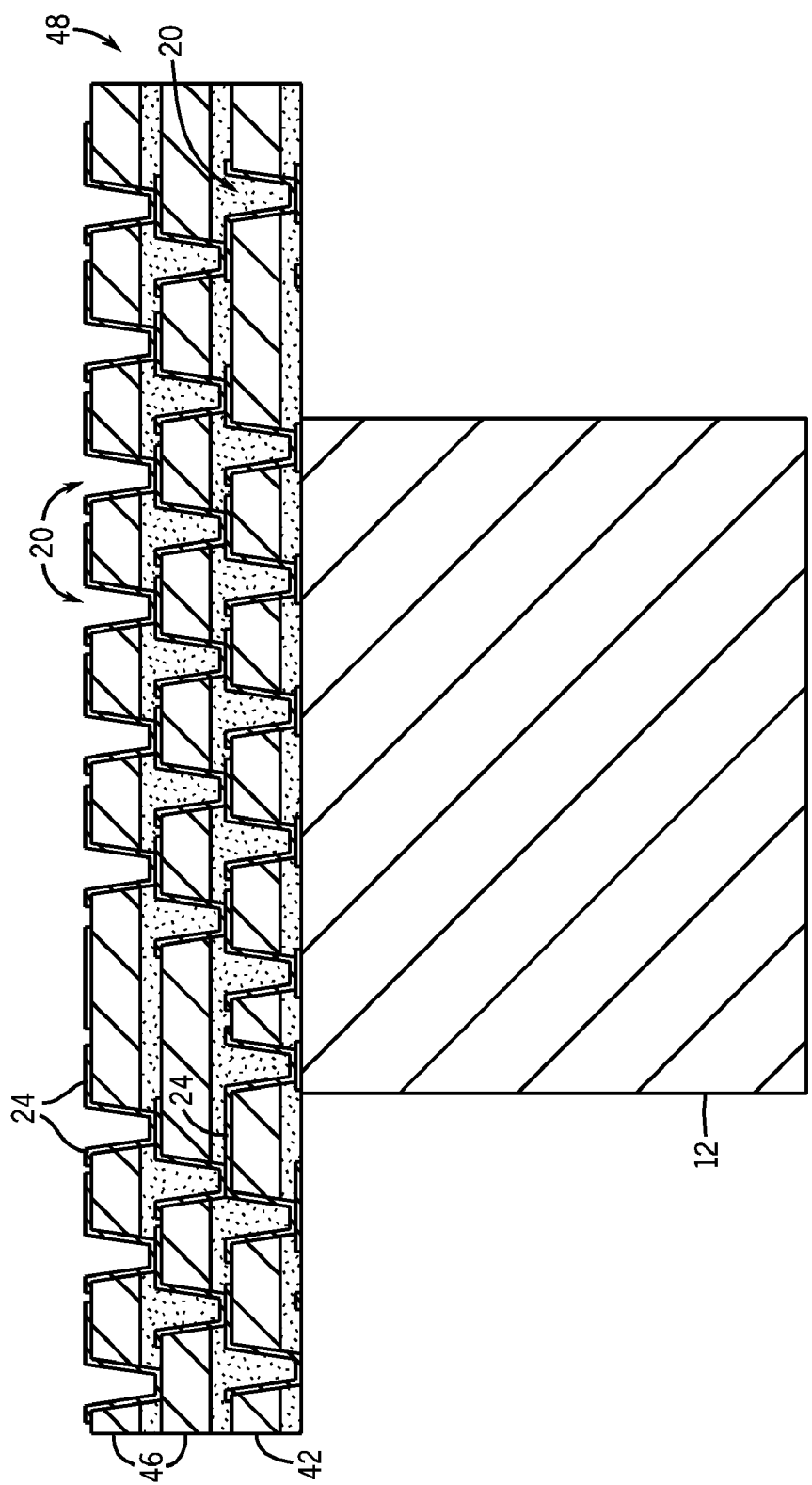
FIG. 10 is a schematic cross-sectional side view of an embedded chip package during a stage of a manufacturing/build-up process where the die is joined to a second chip portion according to another embodiment of the invention.

Referring now to FIG. 10, according to another embodiment of the invention, it is recognized that the second chip portion 48 and die 12 could be tested as a separate unit prior to their connection to the lamination stack 30 (FIG. 7). In this embodiment, die 12 is first affixed to uncut, unpatterned base re-distribution layer 42 before affixing lamination stack 30 to the base re-distribution layer 42. The uncut, unpatterned base re-distribution layer 42 is patterned by forming vias 20 and metal interconnects 24 thereon, and additional uncut, unpatterned re-distribution layers 46 are added to the base re-distribution layer 42 and subsequently patterned, until a desired second chip portion 48 is completed. After completion of the second chip portion 48, the combination of the second chip portion 48 and die 12 can be tested for full electrical function prior to the securing and electrical connection of the lamination stack 30 (FIG. 7) to the second chip portion 48. Thus, according to this embodiment, each of the first chip package 30 (i.e., lamination stack) and the second chip package 48 can be tested prior to connection of the two portions 30, 48.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, an embedded chip package includes a first chip portion comprising a plurality of pre-patterned re-distribution layers joined together to form a pre-patterned lamination stack, the pre-patterned lamination stack having a die opening extending therethrough. The embedded chip package also includes a die positioned in the die opening and a second chip portion comprising at least one uncut re-distribution layer, the second chip portion affixed to each of the first chip portion and the die and being patterned to be electrically connected to both of the first chip portion and the die.

According to another embodiment of the invention, a method of forming an embedded chip package includes providing an initial polymer laminate layer and patterning the initial polymer laminate layer to include a plurality of vias and a plurality of metal interconnects, such that each of the plurality of metal interconnects extends down through a respective via. The method also includes laminating a plurality of additional polymer laminate layers to the initial polymer laminate layer to form a laminate stack, patterning each of the additional polymer laminate layers to include a plurality of vias and a plurality of metal interconnects, and cutting a die opening through the laminate stack. The method further includes adhering the laminate stack to a base unpatterned polymer laminate layer, adhering a die to the base unpatterned polymer laminate layer, the die positioned within the die opening of the laminate stack, and patterning the base unpatterned polymer laminate layer to include a plurality of vias and a plurality of metal interconnects, so as to electrically connect the base unpatterned polymer laminate layer to the die and to the laminate stack.

According to yet another embodiment of the invention, a method for manufacturing a wafer level package includes sequentially laminating a plurality of re-distribution layers to form a pre-patterned lamination stack, each of the plurality of re-distribution layers having a plurality of vias and metal interconnects formed therein. The method also includes forming a die opening in the pre-patterned lamination stack, securing the pre-patterned lamination stack to an uncut base re-distribution layer, affixing a die to the uncut base re-distribution layer, the die positioned within the die opening of the pre-patterned lamination stack, and forming a plurality of vias and metal interconnects in the uncut base re-distribution layer to electrically connect the uncut base re-distribution layer to the die and to the pre-patterned lamination stack.

What is claimed as new and desired to be protected by Letters Patent of the United States is:

1. A method of forming an embedded chip package comprising:
   providing an initial polymer laminate layer;
   patterning the initial polymer laminate layer to include a plurality of vias and a plurality of metal interconnects, such that each of the plurality of metal interconnects extends down through a respective via;
   laminating a plurality of additional polymer laminate layers to the initial polymer laminate layer to form a laminate stack;
   patterning each of the additional polymer laminate layers to include a plurality of vias and a plurality of metal interconnects;
   cutting a die opening through the laminate stack;
   adhering the laminate stack to a base unpatterned polymer laminate layer;
   adhering a die to the base unpatterned polymer laminate layer, the die positioned within the die opening of the laminate stack; and
   patterning the base unpatterned polymer laminate layer to include a plurality of vias and a plurality of metal interconnects, so as to electrically connect the base unpatterned polymer laminate layer to the die and to the laminate stack.

2. The method of claim 1, wherein cutting a die opening comprises laser drilling the laminate stack to form the die opening in an interior portion of the laminate stack.

3. The method of claim 1, wherein adding additional polymer layers comprises adding at least one additional polymer layer to each of a front surface and a back surface of the initial polymer laminate layer.

4. The method of claim 3, wherein patterning each of the additional polymer laminate layers comprises:
   forming the plurality of vias in each of the at least one additional polymer layers on the front surface of the initial polymer laminate layer from a first direction; and
   forming the plurality of vias in each of the at least one additional polymer layers on the back surface of the initial polymer laminate layer from a second direction.

5. The method of claim 1, wherein forming the plurality of metal interconnects comprises:
   depositing a metal material on the polymer laminate layer; and
   patterning and etching the metal material to form the metal interconnects.

6. The method of claim 1, further comprising:
   adhering additional unpatterned polymer laminate layers to the base unpatterned polymer laminate layer; and
   patterning each of the additional unpatterned polymer laminate layers to include a plurality of vias and a plurality of metal interconnects.

7. The method of claim 6, further comprising attaching a plurality of input/output (I/O) connections to the metal interconnects on a topmost unpatterned polymer laminate layer.

8. A method for manufacturing a wafer level package comprising:
   sequentially laminating a plurality of re-distribution layers to form a pre-patterned lamination stack, each of the plurality of re-distribution layers having a plurality of vias and metal interconnects formed therein;
   forming a die opening in the pre-patterned lamination stack;
   securing the pre-patterned lamination stack to an uncut base re-distribution layer;
   affixing a die to the uncut base re-distribution layer, the die positioned within the die opening of the pre-patterned lamination stack; and
   forming a plurality of vias and metal interconnects in the uncut base re-distribution layer to electrically connect the uncut base re-distribution layer to the die and to the pre-patterned lamination stack.

9. The method of claim 8 further comprising patterning each of the plurality of re-distribution layers between the sequential lamination of each re-distribution layer to form the plurality of vias and metal interconnects.

10. The method of claim 8 wherein sequentially laminating a plurality of re-distribution layers comprises:
    providing an initial re-distribution layer; and
    laminating additional re-distribution layers to the initial re-distribution layer using a double sided lamination process.

11. The method of claim 10 further comprising patterning each of the additional re-distribution layers on an outward facing surface between the sequential laminating of each re-distribution layer to form the plurality of vias and metal interconnects.

12. The method of claim 8 wherein forming a die opening comprises laser ablating the pre-patterned lamination stack to form the die opening in an interior portion of the pre-patterned lamination stack.

13. The method of claim 8 further comprising:
securing additional uncut re-distribution layers to the uncut base re-distribution layer; and
patterning each of the additional uncut re-distribution layers to from a plurality of vias and metal interconnects therein.

14. The method of claim 13 further comprising attaching a plurality of input/output (I/O) connections to the metal interconnects on one of the base uncut re-distribution layer and a topmost additional uncut re-distribution layer.

15. An embedded chip package comprising:
a first chip portion comprising a plurality of pre-patterned re-distribution layers joined together to form a pre-patterned lamination stack, the pre-patterned lamination stack having a die opening extending therethrough that is formed subsequent to joining together of the plurality of pre-patterned re-distribution layers to form the pre-patterned lamination stack;
a die positioned in the die opening; and
a second chip portion comprising at least one uncut re-distribution layer, the second chip portion affixed to each of the first chip portion and the die and being patterned to be electrically connected to both of the first chip portion and the die;
wherein the plurality of pre-patterned re-distribution layers comprises:
a center re-distribution layer having a first surface facing in a first direction and a second surface facing in a second direction opposite from the first direction;
at least one additional re-distribution layer adhered to the first surface of the center re-distribution layer and extending out in the first direction;
at least one additional re-distribution layer adhered to the second surface of the center re-distribution layer and extending out in the second direction;
wherein each of the at least one additional re-distribution layers adhered to the first surface of the center re-distribution layer comprises a plurality of vias and a plurality of metal interconnects extending generally from the first direction toward the second direction; and
wherein each of the at least one additional re-distribution layers adhered to the second surface of the center re-distribution layer comprises a plurality of vias and a plurality of metal interconnects extending generally from the second direction toward the first direction.

\* \* \* \* \*